United States Patent

Sato et al.

[11] Patent Number: 5,961,776
[45] Date of Patent: Oct. 5, 1999

[54] SURFACE PROCESSING APPARATUS

[75] Inventors: Hisaaki Sato; Yukito Nakagawa, both of Tokyo; Ken-ichi Takagi, Ehime-ken; Tomoaki Koide, Tokyo; Tsutomu Tsukada, Chiba-ken, all of Japan

[73] Assignee: Anelva Corporation, Tokyo, Japan

[21] Appl. No.: 08/972,945

[22] Filed: Nov. 19, 1997

[30] Foreign Application Priority Data

Feb. 19, 1997 [JP] Japan .......................... 9-50948

[51] Int. Cl.⁶ ...................................................... H05H 1/00
[52] U.S. Cl. ............................. 156/345; 118/723 MW; 204/298.38
[58] Field of Search ................... 118/723 MA, 723 MW, 118/723 ME, 723 MR; 156/345; 204/298.38

[56] References Cited

U.S. PATENT DOCUMENTS

| 4,985,109 | 1/1991 | Otsubo et al. ............................. 156/345 |
| 5,698,036 | 12/1997 | Ishii et al. ......................... 118/723 MW |

FOREIGN PATENT DOCUMENTS

| 56-96841 | 8/1981 | Japan . |
| 8-31444 | 3/1996 | Japan . |
| 8-246146 | 9/1996 | Japan . |

*Primary Examiner*—Thi Dang
*Attorney, Agent, or Firm*—Burns, Doane, Swecker & Mathis, L.L.P.

[57] ABSTRACT

A surface processing apparatus includes a microwave generator which generates low UHF band microwaves of from 300 MHz to 1 GHz, a cavity resonator in which the microwaves generated in the microwave generator resonate in the TM 010 mode, an airtight process chamber which is connected to the cavity resonator, a radiation plate which is arranged in a part of the cavity resonator which is connected with the process chamber, the radiation plate has a plurality of radiation holes which are established symmetrically with respect to a central axis of the cavity resonator, and cover plates made of a dielectric material which close off the radiation holes in an airtight manner.

5 Claims, 11 Drawing Sheets

SURFACE PROCESSING APPARATUS

BACKGROUND OF THE INVENTION

1. Field of the Invention

The invention concerns a surface processing apparatus in which the surface of an object is subjected to plasma processing, and it concerns a plasma processing apparatus in which semiconductor elements are made by plasma processes such as dry etching, plasma enhanced chemical vapor deposition (PECVD) and sputtering.

2. Description of Related Art

The surfaces of objects are frequently processed using plasma when making semiconductor elements such as LSI (large integrated circuits) and flat panel displays such as LCD (liquid crystal displays).

Non-equilibrium plasma, the so-called low temperature plasma, is widely used as a means of effectively carrying out surface reactions with chemically active radicals while keeping the surface of the object at a low temperature. Systems in which plasma is generated using high frequencies have been adopted in the past as a means of generating such low temperature plasmas.

An apparatus in which microwaves were used was developed long ago as a type of surface processing apparatus in which plasma was generated using high frequencies. In this case, for imparting energy to the electrons, the method in which the frequency at which the electrons are made to undergo cyclotron motion by the action of a magnetic field is matched to a microwave frequency and a resonance state is achieved, and the method in which the microwaves are introduced into a cavity resonator and their amplitude is increased, have been used as methods of imparting energy to electrons.

Conventional apparatus of the latter type to which the invention of the present invention relates is described below.

The apparatus indicated in Japanese Unexamined Patent Application 56-96841 can be cited as an example of a surface processing apparatus in which a cavity resonator is used. A drawing of the conventional surface processing apparatus indicated in Japanese Unexamined Patent Application 56-96841 is shown in FIG. 8.

In the surface processing apparatus of this conventional apparatus, the microwaves generated in the microwave generator 1 are introduced into the cavity resonator 2 and resonate. The surface processing of the substrate 30 which has been mounted on the substrate mounting platform 31 inside the process chamber 3 is carried out by means of the plasma which has been generated thereby. The gas supply port 32 and the exhaust port 33 are established in the process chamber 3. Gas is introduced into the process chamber 3 and the abovementioned plasma is generated in this gaseous atmosphere.

With the conventional surface processing apparatus shown in FIG. 8, the plasma is generated in the cavity resonator 2 and so the resonance conditions of the cavity resonator 2 are inevitably changed by the effect of the plasma. Consequently there is a disadvantage in that the plasma is unstable.

Apparati of the type indicated below have been developed for resolving this problem, and these include those indicated in Japanese Unexamined Patent Application H8-246146 and in Japanese Examined Patent Publication H8-31444. As an example, a drawing of the conventional surface processing apparatus indicated in Japanese Examined Patent Publication H8-31444 is shown in FIG. 9.

In the surface processing apparatus shown in FIG. 9, a dielectric plate 41 is established between the cavity resonator 2 and the process chamber 3 for dividing the cavity resonator 2 and the process chamber 3.

A chamber flange 34 is established as shown in FIG. 9 on an edge of the upper opening of the process chamber 3. A gas delivery port 32 is formed in this chamber flange 34. The edge of the bottom opening of the cavity resonator 2 is joined onto the chamber flange 34. A vacuum seal is achieved by establishing a seal 9, such as an 0-ring in the joint between the two parts.

The dielectric plate 41 is held around the edge by a metal flange 42. The metal flange 42 and the dielectric plate 41 are joined by soldering in an air-tight manner. A clearance is formed circumferentially between the chamber flange 34 and the metal flange 42. This clearance forms a gas channel for the gas which is delivered from the gas delivery port 32. The gas which has been delivered from the gas delivery port 32 enters the abovementioned clearance and is diffused circumferentially.

A gas diffusing plate 50 is established on the lower side of the dielectric plate 41. The gas diffusing plate 50 is hollow inside and has a plurality of gas discharge holes, not shown in the drawing, established uniformly so as to front onto the space inside the process chamber 3. The gas which has diffused circumferentially in the abovementioned clearance is blown into the process chamber 3 via the inside of the gas diffusing plate 50.

A metal plated film 21 is coated on the surface of the process chamber 3 side surface of the dielectric plate 41. This metal plated film 21 is patterned in the form of slits of length greater than half the wavelength of 2.45 GHz microwaves. The microwaves which resonate inside the cavity resonator 2 pass through the metal plated film 21 and radiate into the process chamber 3, and then plasma is generated in the gas atmosphere within the process chamber 3.

OBJECTS AND SUMMARY

The provision of processing regions which have a greater area is one of the more recent requirements of surface processing apparatus. This requirement has arisen from the need for increasing the number of semiconductor circuit elements which can be produced with a single large semiconductor wafer. In the case of a flat panel display such as an LCD it is necessary to have a large processing region so that the large glass substrates from which the flat panel display for the large display screens are made can be accommodated.

In surface processing apparatus in which plasma is generated using microwaves as described above, it is thought that a microwave frequency lower than the conventional 2.45 GHz would be preferred for such a large processing region. The reasons for this are indicated below.

The size of the abovementioned resonator is determined so as to match the volume of the processing region. As the processing region is increased in size, the volume of the cavity resonator is also increased. In this case, the wavelength of the microwaves with respect to the size of the cavity resonator becomes relatively shorter with high frequency microwaves. The microwaves resonate in the cavity resonator in a state of a single wavelength or with the formation of a plurality of crests of at least 1.5 wavelengths. There are cases where the plasma density becomes irregular when a plasma is generated using microwaves which are resonating with the formation of a plurality of crests. The processing of the substrate is irregular if the plasma density is irregular. Hence, it is best to use microwaves of lower frequency as the processing region becomes larger.

For this reason, the inventors of the present invention thought that the low ultra-high frequency (UHF) band (300 MHz to 1 GHz) microwaves, which have a shorter wavelength than the conventional 2.45 GHz microwaves mentioned above, would be useful. The inventors of this application therefore made a prototype apparatus using microwaves in this band. A front view of the prototype surface processing apparatus made by the inventors using low UHF band microwaves is shown in FIG. 10.

The surface processing apparatus shown in FIG. 10 has a microwave generator 1 which generates low UHF band microwaves. The microwaves generated in the microwave generator 1 are introduced into the cavity resonator 2 via the coaxial line 11. The process chamber 3 is connected via the dielectric plate 41 to the cavity resonator 2. The process chamber 3 also has a gas delivery system 5 which delivers gas from the gas delivery port 32 into the process chamber 3. Moreover, the process chamber 3 also has a pumping system 6 which pumps out the interior of the process chamber 3 via the pump out port 33. The substrate mounting platform 31 is established inside the process chamber 3.

The cavity resonator 2 is a cylindrical type resonator in which the microwaves resonate in the transverse magnetic (TM) 010 mode. The cylinder axis is orientated in the up-down direction in the drawing. The TM 010 mode is such that the distribution of the electromagnetic field has perfect axial symmetry, so more or less uniform plasma is generated in a plane perpendicular to the center axis. By mounting the substrate 30 parallel to this plane it is possible to achieve uniform processing of the surface of the substrate 30.

The construction in which the microwaves are radiated into the process chamber 3 from the cavity resonator 2 in the apparatus shown in FIG. 10 is different from that of the apparatus shown in FIG. 9. A radiation plate 22, which is a wall part of the cavity resonator 2, is established on the cavity resonator 2 side of the dielectric plate 41.

The radiation plate 22 is made of metal, and as shown in FIG. 11, has a plurality of circular holes 23 established with axial symmetry. The microwaves resonating in the cavity resonator 2 pass through the circular holes (referred to hereinafter as radiation holes) 23 and radiate into the process chamber 3 through the dielectric plate 41. The radiated microwaves then generate plasma in the process chamber 3.

The problems indicated below were discovered as a result of the inventors' investigations with the conventional surface processing apparatus shown in FIG. 9 and the prototype surface processing apparatus shown in FIG. 10.

When a substrate 30, which has a large area is being processed, the volume of the cavity resonator 2 must also be correspondingly large. In this case, with the apparatus shown in FIG. 9 or FIG. 10, the increased size of the cavity resonator 2 resulted in an increase in the size of the dielectric plate 41 which separates the cavity resonator 2 and the process chamber 3. For example, if the diameter of the semiconductor wafer is increased to 300 mm, then the process chamber 3 must have a cylindrical form of internal diameter about 400 mm. In this case, the dielectric plate 41 must also have a circular shape of diameter about 400 mm.

The interior of the process chamber 3 is pumped out with the pumping system 6 and becomes a vacuum environment, while atmospheric pressure is maintained in the cavity resonator 2. This pressure difference is applied across the dielectric plate 41. If, in this case, the diameter is 400 mm, then a dielectric plate 41 of thickness about 30 mm must be used to withstand the pressure difference. However, if a dielectric plate 41 of this thickness is used, then the proportion by which the microwaves which are radiated from the cavity resonator 2 are damped on passing through the dielectric plate 41 is increased. Consequently, there is a problem in that the plasma generating efficiency (the ratio of plasma density generated with respect to the input microwave power) is reduced.

When the dielectric plate 41 is increased in size, a problem also arises in terms of the mechanical strength of the soldering between the dielectric plate 41 and the metal flange 42. The soldering between the dielectric plate 41 and the metal flange 42 is heated to a temperature of some 1000° C. when the soldering is being carried out. It is also heated by the heat from the plasma when plasma is generated in the process chamber 3.

The thermal expansion coefficients of the dielectric plate 41 and the metal flange 42 are different, and so the soldered area increases as the dielectric plate 41 becomes larger and the difference in the extent of the thermal expansions of the two parts becomes greater. As a result, cracks are formed in the soldered area and gaps appear, and there is a problem in that the vacuum seal may be destroyed. The amount of solder which is used must be increased and the soldering must be carried out very carefully in order to stop this from occurring. However, if the amount of solder which is used is increased, then the response of the dielectric plate 41 to the heat is increased and there is a risk of cracks forming in the dielectric plate 41. The complexity of the soldering operation is thus increased.

The present inventions are intended to resolve such problems and to provide a practical apparatus with which uniform plasma is generated in a large region using low UHF band microwaves and with which it is possible to carry out uniform surface processing of objects which have a large surface area.

In order to resolve the problems mentioned above, a surface processing apparatus of the present invention has a microwave generator which generates microwaves in the low UHF band from 300 MHz to 1 GHz and a cavity resonator in which the microwaves which have been generated in this microwave generator resonate in the TM 010 mode. The cavity resonator has a radiation plate which is arranged in the part which is connected to the process chamber. The radiation plate has a plurality of circular radiation holes established symmetrically with respect to the axis of the cavity resonator. Microwaves are radiated toward the process chamber from the radiation holes. A dielectric cover plate which closes the radiation holes in an airtight manner is established for each radiation hole.

Moreover, the surface processing apparatus has an airtight process chamber which is connected to the cavity resonator. The process chamber has a gas delivery system which delivers gas to the process chamber and a pumping system which pumps out the interior of the process chamber. Plasma is generated in the process chamber by the microwaves which are radiated from the cavity resonator. The desired processing of the object which has been mounted in the process chamber is carried out with this plasma.

Furthermore, in order to resolve the abovementioned problems, in an embodiment of the present invention, the cavity resonator has a re-entrant form.

Moreover, in order to resolve the abovementioned problems, another embodiment of the present invention is such that the distance from the center axis of the cavity resonator to the centers of the plurality of radiation holes is within the range of 70±10% of the radius of the cavity resonator.

Moreover, in order to resolve the abovementioned problems, another embodiment of the present invention is such that a metal control plate, which controls the extent of coupling of the microwaves of the cavity resonator and the process chamber by closing off parts of the radiation holes, is established for all of the plurality of radiation holes.

As is clear from the description herein, according to at least one embodiment of the present invention, uniform surface processing is carried out even in those cases where the processing region is increased in size since low UHF band microwaves are being used. Uniform surface treatment is also possible because a cavity resonator which resonates in the TM 010 mode is used. The cavity resonator and the process chamber are separated and the plasma is generated in a place other than the cavity resonator and so the change in the resonance conditions due to the presence or absence of plasma is small. The coupling of microwaves of the cavity resonator and the process chamber is also carried out through a plurality of circular radiation holes which are formed with axial symmetry. This also contributes to uniform surface treatment with a uniform plasma. Moreover, cover plates which cover each of the radiation holes are used as dielectric parts which transmit microwaves and ensure the airtightness of the process chamber. Damping of the microwaves by the dielectric plate can be reduced in this way, and the plasma generating efficiency is increased.

According to one aspect of the present invention, in addition to the technologically effective results described above, the cavity resonator is of the re-entrant type and so the degrees of freedom in terms of the size of the cavity resonator and the design of the oscillation frequency of the microwave generator are increased.

According to another aspect of the present invention, the radiation holes are formed at optimum positions and so the microwaves are radiated with good efficiency from the cavity resonator into the process chamber. The plasma generating efficiency is increased as a result.

According to another aspect of the present invention, the degree of coupling of microwaves of the cavity resonator and the process chamber is controlled by closing off part of each radiating hole and so the degree of coupling which maximizes the plasma generating efficiency can be established easily.

DETAILED DESCRIPTION OF THE PREFERRED EMBODIMENTS

Embodiments of the inventions of this application are described below.

Figure 1:
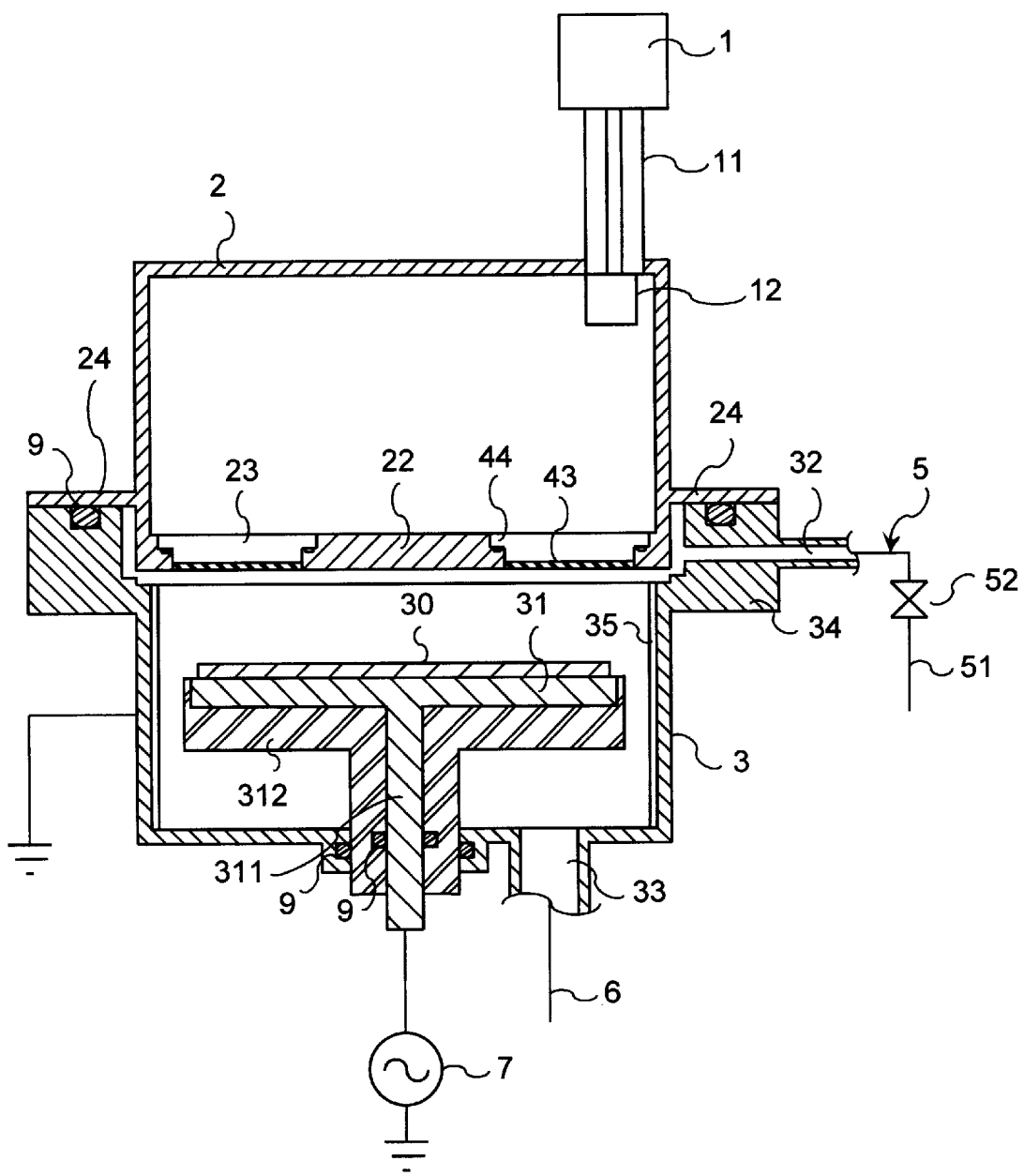
FIG. 1 is a front view which shows a surface processing apparatus which is an embodiment of an invention of this application. 5
Figure 2:
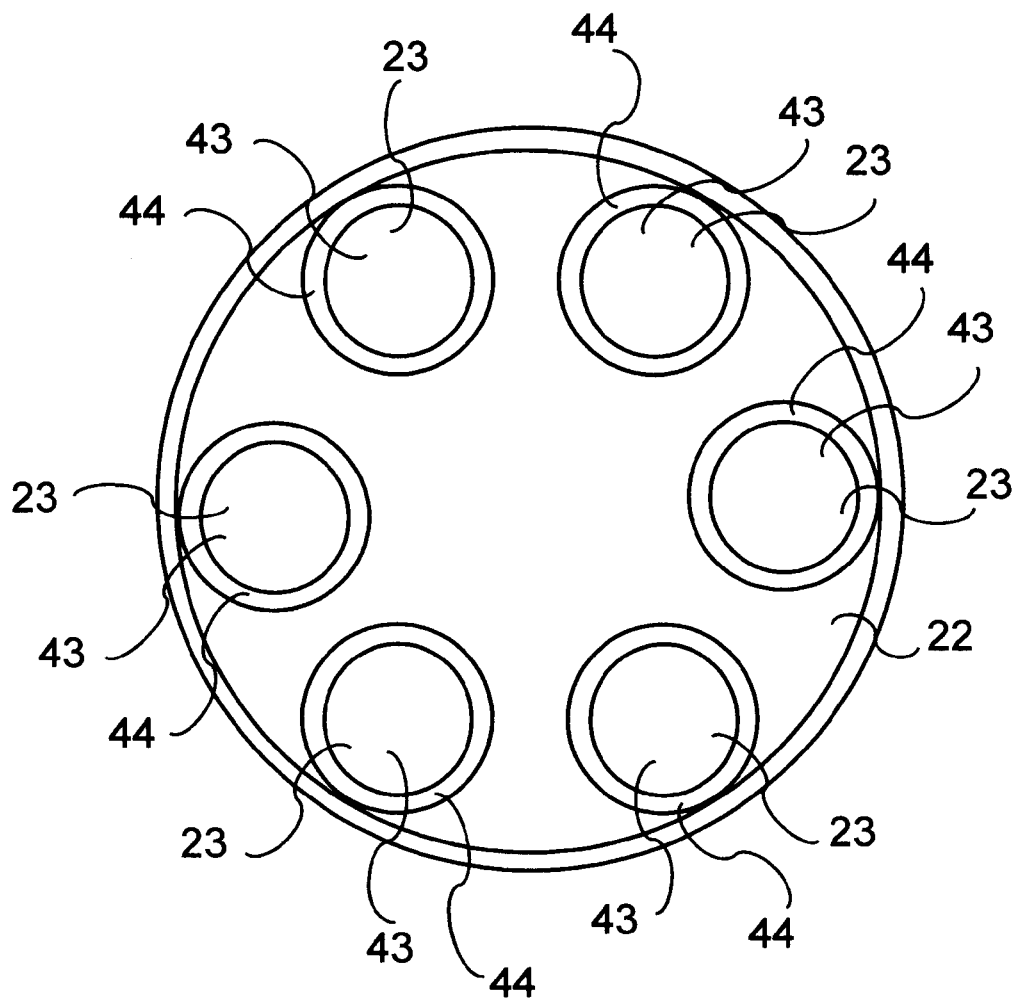
FIG. 2 is a plan view which shows the radiation plate of the apparatus shown in FIG. 1.

A front view of a surface processing apparatus which is an embodiment of an invention of this application is shown in FIG. 1, and a plan view of the radiation plate of the apparatus shown in FIG. 1 is shown in FIG. 2.

The surface processing apparatus shown in FIG. 1 has a microwave generator 1 which generates low UHF band microwaves. The microwaves which have been generated in the microwave generator 1 are introduced into a cavity resonator 2 via a coaxial line 11. An airtight process chamber 3 is connected to the cavity resonator 2. The process chamber 3 has a gas delivery system 5 which delivers gas into the process chamber 3 from a gas delivery port 32. Moreover, the process chamber 3 has a pumping system 6 which pumps out the interior of the process chamber 3 from a pump out port 33. The process chamber 3 has within it a platform 31 on which the substrate is mounted.

A magnetron or solid state source is frequently used for the microwave generator 1, and the frequency is a low UHF band, for example 500 MHz. Furthermore, the output of the microwave generator is of the order of 2 kW.

The coaxial line 11 is a double line through which microwaves propagate, and it comprises an internal conductor and a surrounding coaxial external conductor. An insulating material is packed between the inner conductor and the outer conductor as required. A coupling loop 12 is established in the connection to the cavity resonator 2. The microwaves are introduced into the cavity resonator 2 via the coupling loop 12.

The cavity resonator 2 is a cylindrical vessel made of a metal, such as aluminum or stainless steel. The cavity resonator 2 is a cylindrical resonator in which the microwaves which have been generated by the microwave generator 1 resonate in the lowest order TM 010 mode. The resonance frequency of this mode is calculated using the following equation, where a is the cavity radius.

$$\lambda_0 = 2.61a = c/f_0$$

From this equation, $f_0=575$ MHz when $a=200$ mm. Moreover, c is the velocity of light in a vacuum and $\lambda_0$ is the wavelength of the microwaves.

Figure 3:
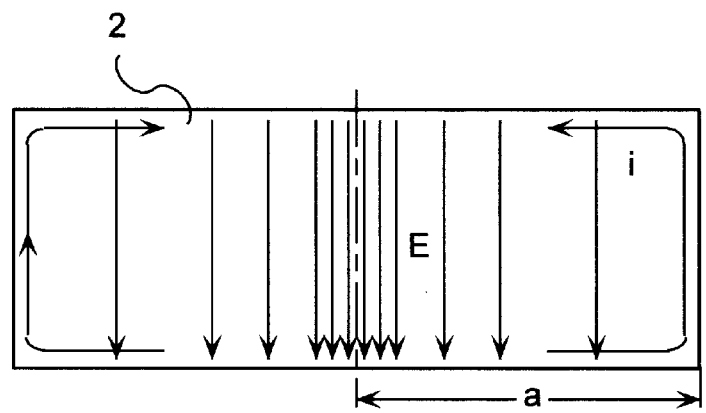
FIG. 3 is a schematic diagram which illustrates TM 010 mode resonance, where 3(A) is a cross-sectional view in the axial direction of a cavity resonator, and 3(B) is a cross-sectional view in the direction perpendicular to the axis.
Figure 3:
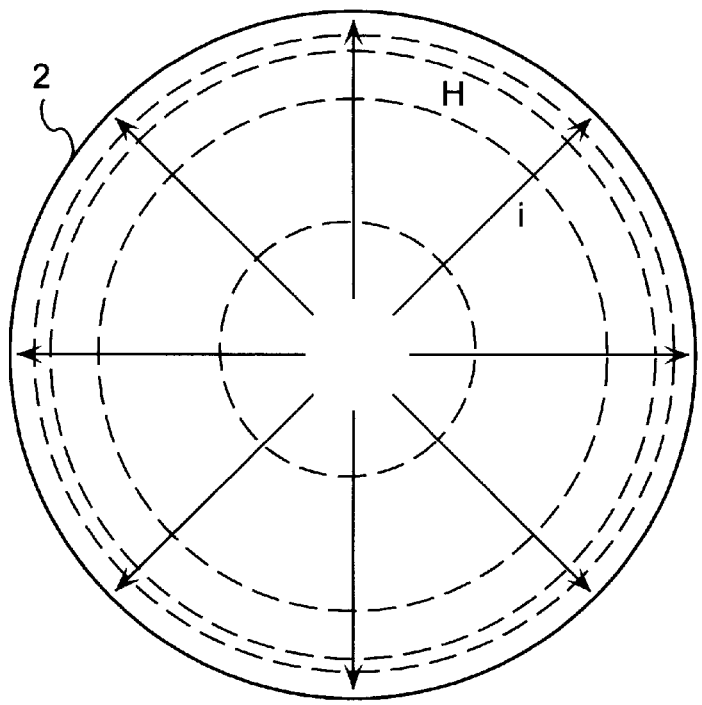

A diagrammatic representation of TM 010 mode resonance is shown in FIG. 3. In FIG. 3(A) is a cross sectional view in the axial direction of the cavity resonator 2, and FIG. 3(B) is a cross sectional view in the direction perpendicular to the axis. In FIG. 3, E represents the electric field, H represents the magnetic field and i represents the electric current. As is shown in FIG. 3, in the TM 010 mode, the distribution of the electromagnetic field has axial symmetry, and a uniform plasma which has good axial symmetry can be formed.

As shown in FIG. 3(A), in the TM 010 mode, the direction of the electric field is axial and, as shown in FIG. 3(B), the direction of the magnetic field is circumferential. The high frequency current flows in the form of radiation from the center toward the perimeter on the bottom plate of the cavity resonator 2, and then flows upward on the side plate and then flows toward the center from the perimeter on the upper plate at a certain instant in time.

A radiation plate 22 is established on the process chamber 3 side of the cavity resonator 2, as described above. The radiation plate 22, as in the apparatus shown in FIG. 9 and FIG. 10, has six radiation holes 23 arranged with equal spacing around a circle centered on the center axis. As shown in FIG. 2, in this embodiment the radiation plate 22 has six radiation holes 23 with equal spacing around a circle which is concentric with the center axis. However, the number of holes is not limited to 6, and there may be 4, 8, 10 or 12 holes, for example.

Each radiation hole 23 radiates the microwaves which are resonating within the cavity resonator 2 into the process chamber 3. The diameter of each radiation hole 23 is less than the radius of the cavity resonator 2 at the largest, and so they are less than ¼ wavelength.

The shape and location of the radiation holes 23 is important in terms of the plasma generating efficiency. In the case of a cylindrical cavity resonator 2 with resonance in the TM 010 mode, the strength of the circumferential direction magnetic field reaches a maximum at a distance of about 70% of the radius of the cavity from the center axis. Hence, in order to maximize the plasma generating efficiency, the centers of the radiation holes 23 are preferably located within 70±10% of the radius of the cavity resonator 2 from the center axis of the cavity resonator 2.

Figure 4:
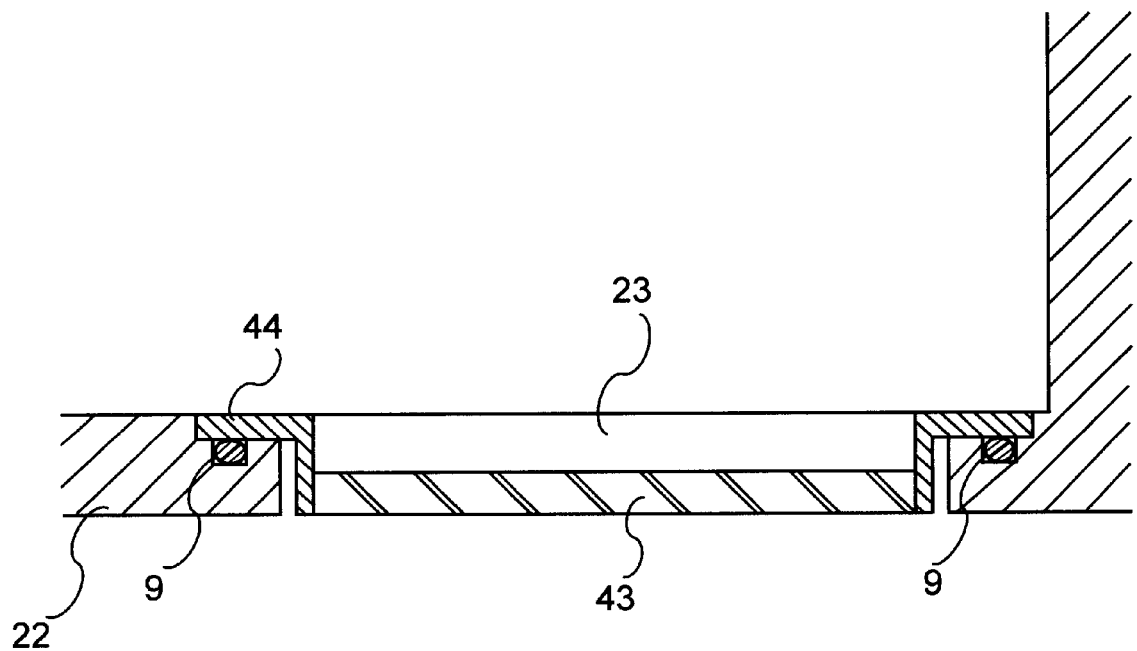
FIG. 4 is a front cross-sectional view which shows a cover plate as fitted in the apparatus shown in FIG. 1.

A front cross-sectional view which shows cover plates 43 which are fitted in the apparatus shown in FIG. 1 is shown in FIG. 4. The cover plates 43, which are made of dielectric material, are established in covering the radiation holes 23 and covering the radiation holes 23 in an airtight manner.

As is clear from FIG. 2, the cover plates 43 are circular plates, and they are formed from quartz glass or alumina material. The cover plates 43 have a diameter which is slightly smaller than the diameter of the radiation holes 23. The cover plates 43 are fitted to the radiation plate 22 with fitting flanges 44, as shown in FIG. 4.

Each fitting flange 44 is made of a metal, such as aluminum or stainless steel, and it is soldered to the side surface of the cover plate 43. The upper edge of the fitting flange 44 has a hook-like shape where it is folded over to the outside.

A step is established in the edge of the radiation hole 23, as shown in FIG. 4, and the hook-like part of the fitting flange 44 is mounted on this step. The hook-like part is pressed against the radiation plate 22 with a force which is due to the pressure difference, and the cover plate 43 is supported in the radiation plate 22 by the fitting flange 44.

A seal 9, such as an 0-ring, is established between the fitting flange 44 and the radiation plate 22. This seal 9 ensures a vacuum seal in the radiation hole 23.

The remaining construction of the apparatus of this embodiment is described below, once again with reference to FIG. 1.

The process chamber 3 has a gas delivery port 32 and a pump out port 33. The vessel flange 34 is established on the edge of the upper opening of the process chamber 3, and the gas delivery port 32 is formed in this vessel flange 34.

As shown in FIG. 1, a clearance is formed between the vessel flange 34 and the edge of the radiation plate 22. This clearance forms a gas channel for the gas which is delivered from the gas delivery port 32. The gas which has been delivered from the gas delivery port 32 is introduced into the clearance mentioned above and diffuses circumferentially.

The flange 24 is formed on the side surface of the cavity resonator 2. This flange 24 is connected in an airtight manner to the vessel flange 34. A seal 9, such as an O-ring, is established between the flange 24 and the vessel flange 34, and a vacuum seal is achieved.

The gas delivery system 5 has a pipework 51 which connects a gas bomb, which is not shown in the drawing, to the gas delivery port 32, and a valve 52 and a mass flow controller, which is not shown in the drawing, which are established in this pipework.

A pump out port 33 is established in the bottom surface part of the process chamber 3. It has a vacuum pump, such as a turbo-molecular pump, which pumps out the interior of the process chamber 3 via the pump out port 33. The pumping system 6 pumps out the interior of the process chamber 3 to a pressure of some 1 to $10^{-3}$ Torr.

The process chamber 3 is a cylindrical chamber of internal diameter, more or less the same as that of the cavity resonator 2, and which is formed from metal such as aluminum or stainless steel. A platform 31 on which the substrate 30 which is to be processed is mounted is established more or less in the middle of the process chamber 3. The substrate mounting platform 31 is made of a metal, such as stainless steel, and is supported by a support 311. The support 311 passes through the base of the process chamber 3 in an airtight manner.

The substrate mounting platform 31 also fulfills the role of an electrode which applies a fixed bias potential to the substrate 30. The substrate mounting platform 31 is connected to an RF power source 7 which is established outside the process chamber 3. A bias potential, which is negative with respect to the plasma, is produced on the substrate 30 on the substrate mounting platform 31 by the interaction of the plasma and the RF voltage which is applied by the RF power source 7. An insulator 312 is established in such a way as to cover the substrate mounting platform 31 and the support 311, and provides insulation from the grounded process chamber 3.

The operation of the apparatus shown in FIG. 1 is described below.

The substrate 30 is transferred into the process chamber 3 through a gate valve, which is not shown in the drawings, which is established in the process chamber 3, and the substrate 30 is mounted on the substrate mounting platform 31. An electrostatic chuck mechanism is established, as required, in the substrate mounting platform 31, and the substrate 30 is held electrostatically.

Gas is delivered through the gas delivery port 32 into the process chamber 3 by the gas delivery system 5, and at the same time, the interior of the process chamber 3 is pumped out by means of the pumping system 6 and the interior of the process chamber 3 is maintained at the set pressure. The microwave generator 1 is made to generate low UHF band microwaves under these conditions. The microwaves are propagated by the coaxial line 11 and introduced into the cavity resonator 2.

The microwaves resonate in the TM 010 mode in the cavity resonator 2, and at the same time, they are radiated into the process chamber 3 through the radiation holes 23 of the radiation plate 22 which are covered by the cover plates 43. The radiated microwaves impart their energy to the gas which is being delivered into the process chamber 3 and plasma is generated.

The prescribed process at the surface of the substrate 30 is carried out using this plasma. For example, when plasma reactive ion etching is being carried out, a gas which generates an active species, for example a fluorine based active species, in plasma is delivered and the substrate 30 is etched by the active species. Furthermore, when plasma enhanced CVD (chemical vapor deposition) is being carried out, a source gas which undergoes a dissociation reaction in plasma is delivered and a prescribed thin film is deposited on the substrate 30.

With a low temperature plasma of the type in this embodiment, the electron temperature of the plasma is low and the plasma potential, which is the accelerating potential of the ions which are incident on the substrate 30, is generally also of the order of some 20 to 30 V. In this case, a bias voltage is generated on the substrate 30 by means of the RF power source 7. The ions in the plasma are attracted and collision with the substrate 30 is promoted. This is ideal in the case of reactive ion etching where a comparatively large energy is required.

In the operation described above, as shown in FIG. 1, the upper surface of the substrate mounting platform 31 is parallel to the radiation plate 22. The electric field between the radiation plate 22 and the substrate mounting platform 31 is perpendicular to the substrate 30, and the radiation of ions onto the substrate 30 occurs uniformly. The parallel relationship between the upper surface of the substrate mounting platform 31 and the radiation plate 22 contributes to uniform processing of the substrate 30.

In the apparatus of the embodiment described above, airtight separation of the cavity resonator 2 and the process chamber 3 is achieved by closing off in an airtight manner the radiation holes 23 of the radiation plate 22 with the cover plates 43. Each of the cover plates 43 is much smaller than the dielectric plate 41 shown in FIG. 9. The mechanical strength required of the individual cover plates 43 is low when compared with that of the dielectric plate 41 shown in FIG. 9, and they can be much thinner.

For example, when the cavity resonator 2 has the same internal diameter of about 400 mm, the diameter of a single cover plate 43 is about 100 mm and its thickness is only of the order of 7 mm. Hence, the damping of the microwaves on transmission through the cover plates 43 was quite small when compared with that with the dielectric plate 41 shown in FIG. 9, and the plasma generation efficiency was greatly improved. When the output of the microwave generator 1 was 2 kW, the ion current density in the plasma was of the order of 20 mA/cm$^2$, and this was some 10% higher than in the conventional apparatus shown in FIG. 9.

Figure 9:
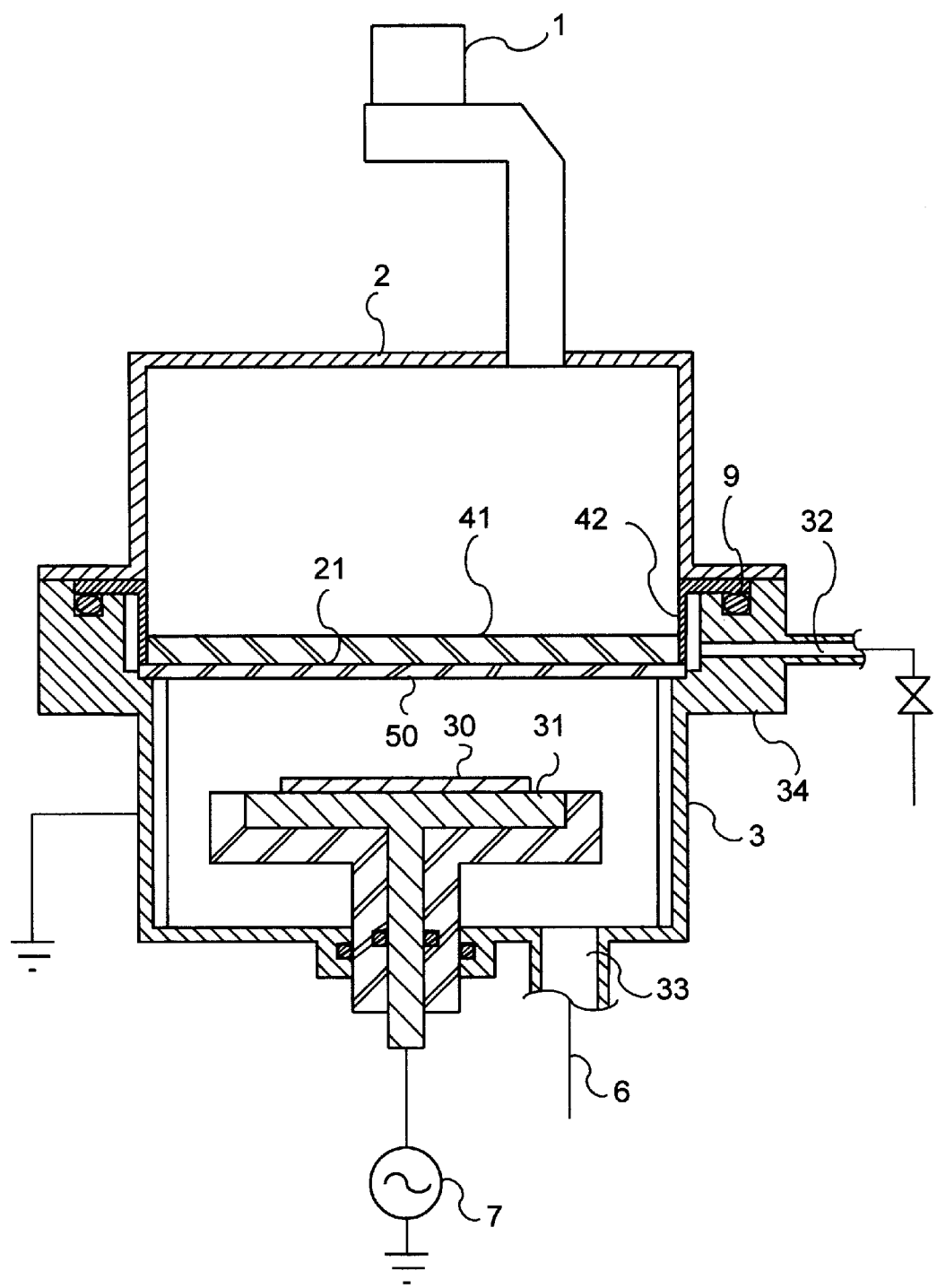
FIG. 9 is a drawing which shows the conventional surface processing apparatus indicated in Japanese Examined Patent Publication H8-31444.
Figure 10:
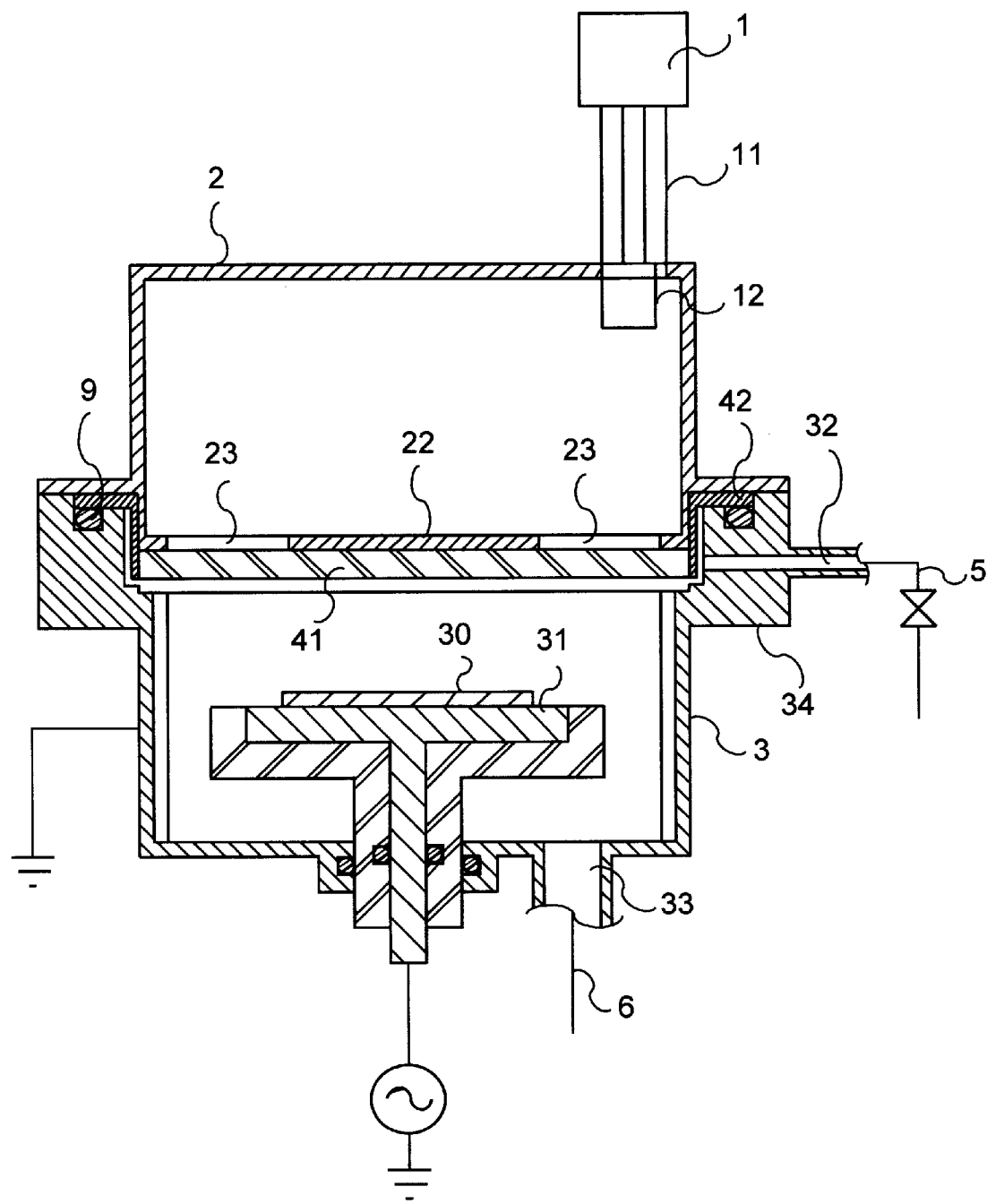
FIG. 10 is a front view which shows the construction of conventional surface processing apparatus made as a prototype by the inventors as an apparatus in which low UHF band microwaves are used.
Figure 11:
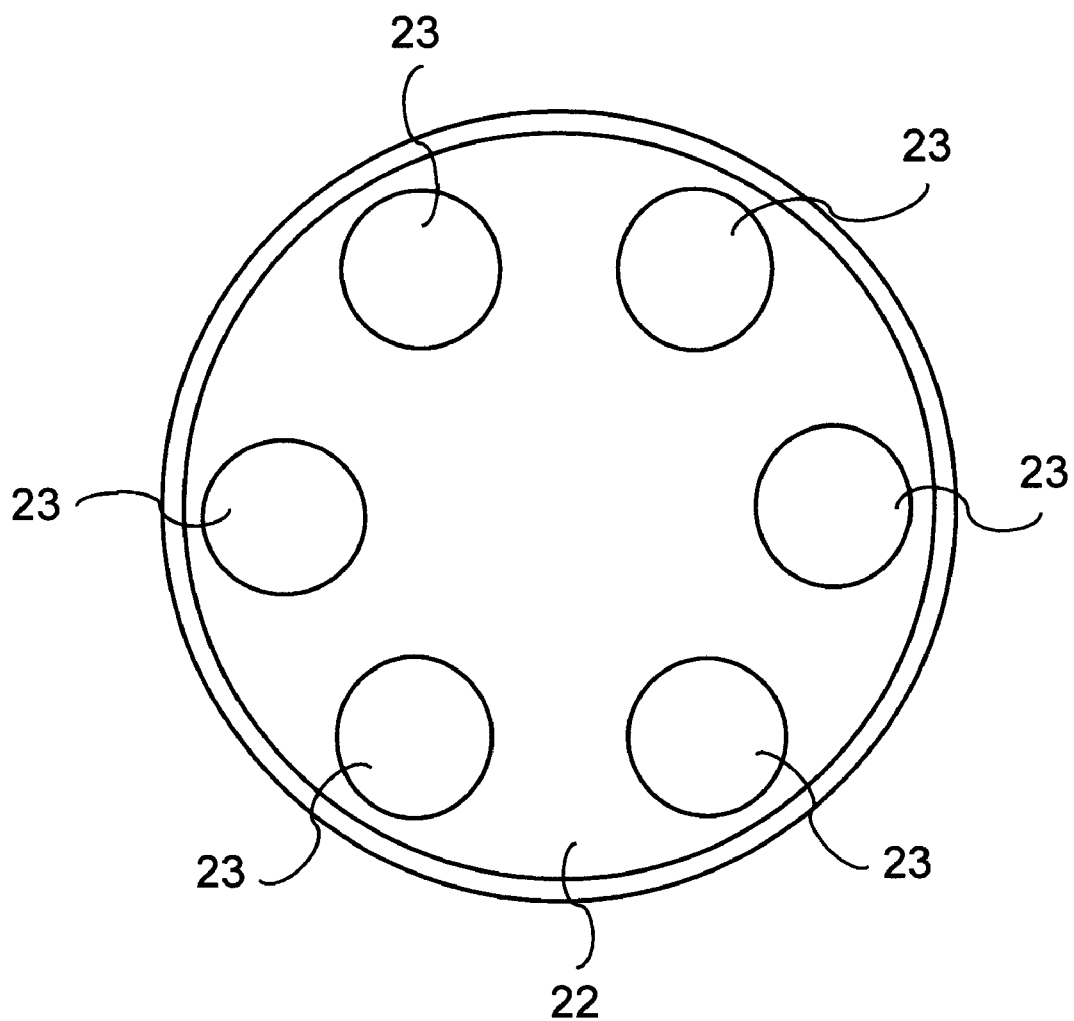
FIG. 11 is a plan view which shows the radiation plate of the apparatus shown in FIG. 1.

Another technologically effective result is that the soldered area when soldering the cover plates 43 to the fitting flanges 44 and the difference in the extent of the thermal expansions are quite small when compared with those in the conventional apparatus shown in FIG. 9. The problems with peeling and cracking of the soldering which is caused by the difference in the extents of the thermal expansions is also reduced, and the soldering operation also becomes very simple.

Another embodiment of an invention of this application is described below.

Figure 5:
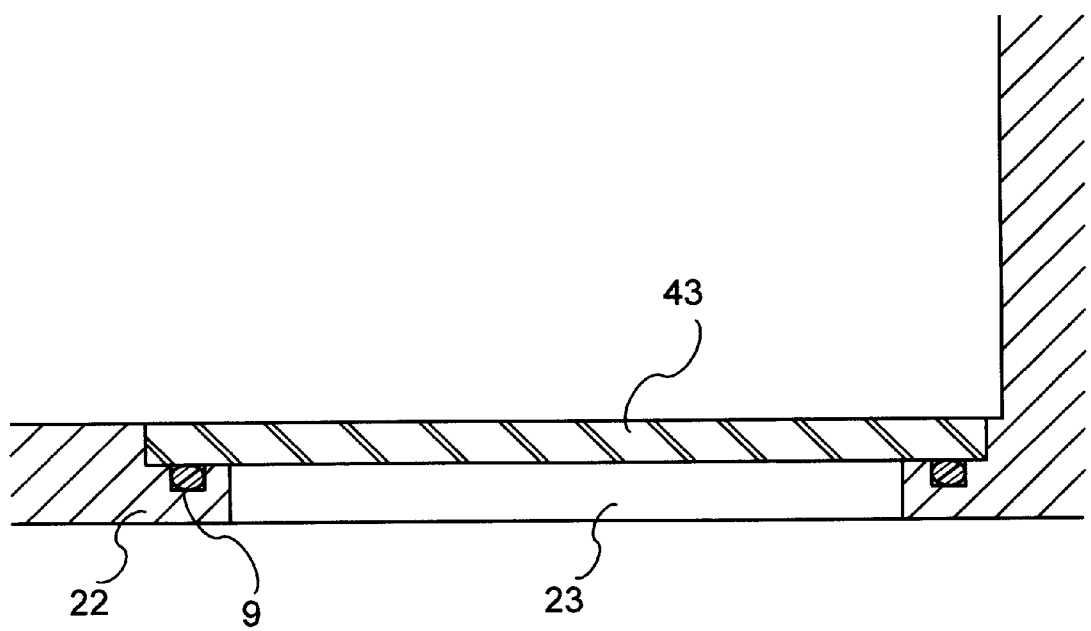
FIG. 5 is a front cross sectional view which shows a cover plate in the apparatus of an embodiment of the invention of this application.

A front cross sectional view which shows the cover plate 43 of another embodiment of the present invention of this application is shown in FIG. 5.

A fitting flange 44 is not used in the embodiment shown in FIG. 5, and the cover plate 43 is simply housed in the radiation hole 23. The radiation hole 23 of the radiation plate 22 has a step of a size which matches the external diameter of the cover plate 43. The cover plate 43 is inserted by being dropped directly onto this step. The seal 9 is established between the cover plate 43 and the step, and a vacuum seal is achieved.

No fitting flange 44 is used in the embodiment shown in FIG. 5, so it is easy to make and the production cost is reduced. However, in those cases where an O-ring is used for the seal 9, the O-ring is exposed to the microwaves through the cover plate 43 and there is a problem in that the O-ring may deteriorate. Hence, the construction of the embodiment shown in FIG. 5 is suitable in those cases where the microwave power is low. The problem indicated above is minimized if a metal seal material such as a gasket is used for the seal 9.

Figure 6:
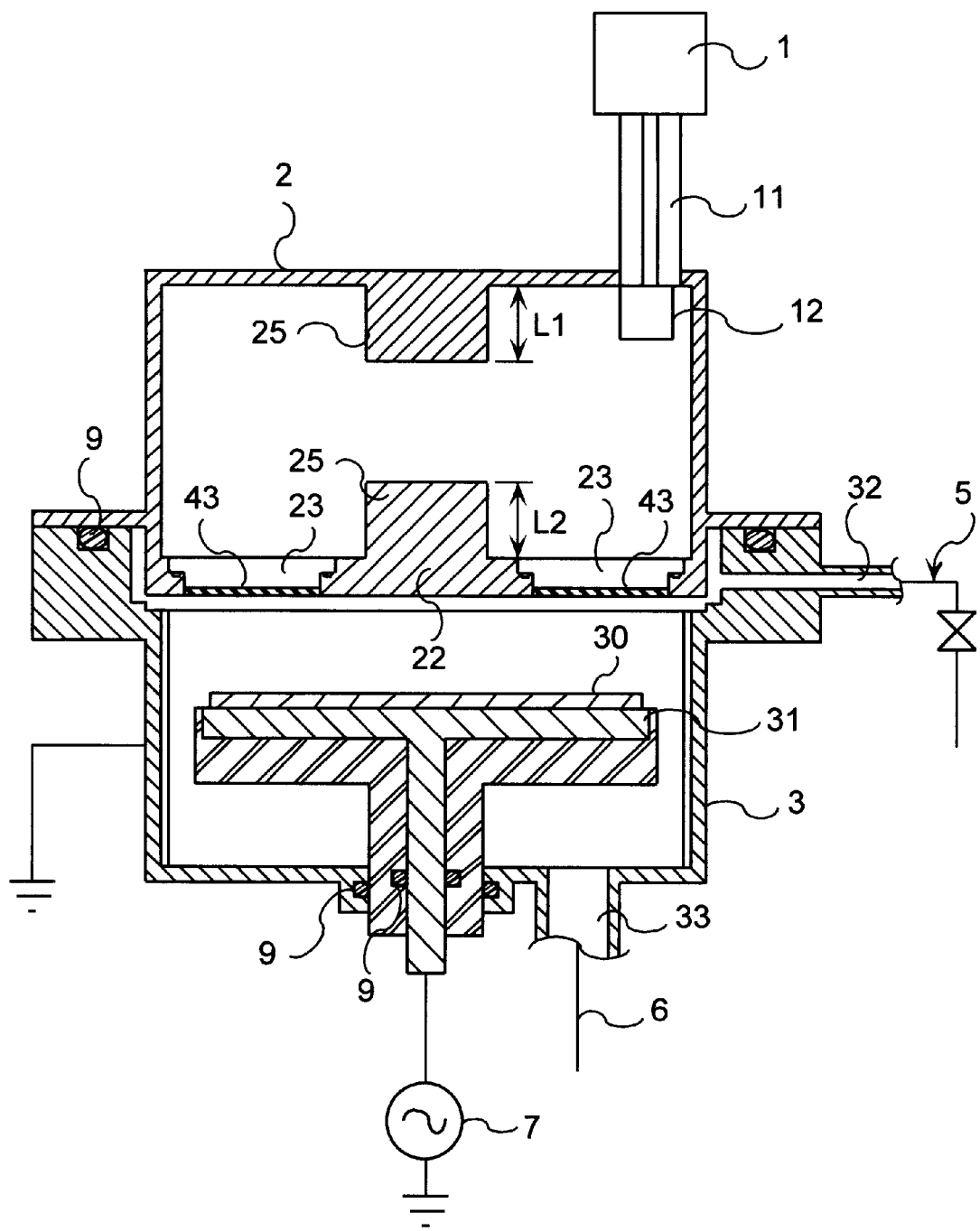
FIG. 6 is a front cross-sectional view which shows surface processing apparatus which is an embodiment of the invention of this application.

A front view which shows another embodiment of a surface processing apparatus of the present invention of this application is shown in FIG. 6. A re-entrant type cavity resonator 2 is used in the embodiment shown in FIG. 6.

The re-entrant type cavity resonator 2 is one in which the central conductor of the cavity type resonator 2 is short, and the resonance frequency can be adjusted by the length (L1 and L2 in FIG. 6) of the central conductor 25.

The size of the cavity resonator 2 is an important parameter among the conditions for achieving resonance, as mentioned earlier, and when the resonance frequency is fixed, the size of the cavity resonator is also inevitably fixed as a result. The size of the cavity resonator 2 inevitably determines the size of the region in which plasma is formed. Hence, the size of the cavity resonator 2 is limited to the size of the substrate 30 which is to be processed. In designing to accommodate the size of the substrate 30 there are cases where the resonance frequency of the cavity resonator 2 inevitably deviates from the preferred value. With the microwave generator 1 there are cases where the frequency at which oscillation is possible is limited, and it is necessary to match the resonance frequency to these frequencies at which oscillation is possible.

The embodiment shown in FIG. 6 was made on the basis of an understanding of these facts. The resonance frequency can be adjusted by suitably setting the length of the central conductor 25, and the degree of freedom in the size of the cavity resonator 2 and in design of the oscillation frequency of the microwave generator 1 are increased.

The central conductor 25 is a cylindrical rod-shaped part, and it is formed of the same metal as the cavity resonator 2. In a case where the internal diameter of the cavity resonator 2 is 350 mm and the oscillation frequency of the microwave generator 1 is 500 MHz, the central conductor 25 is of length (L1+L2) 100 mm and of thickness some 70 mm. A resonance state can be obtained with these settings.

Figure 7:
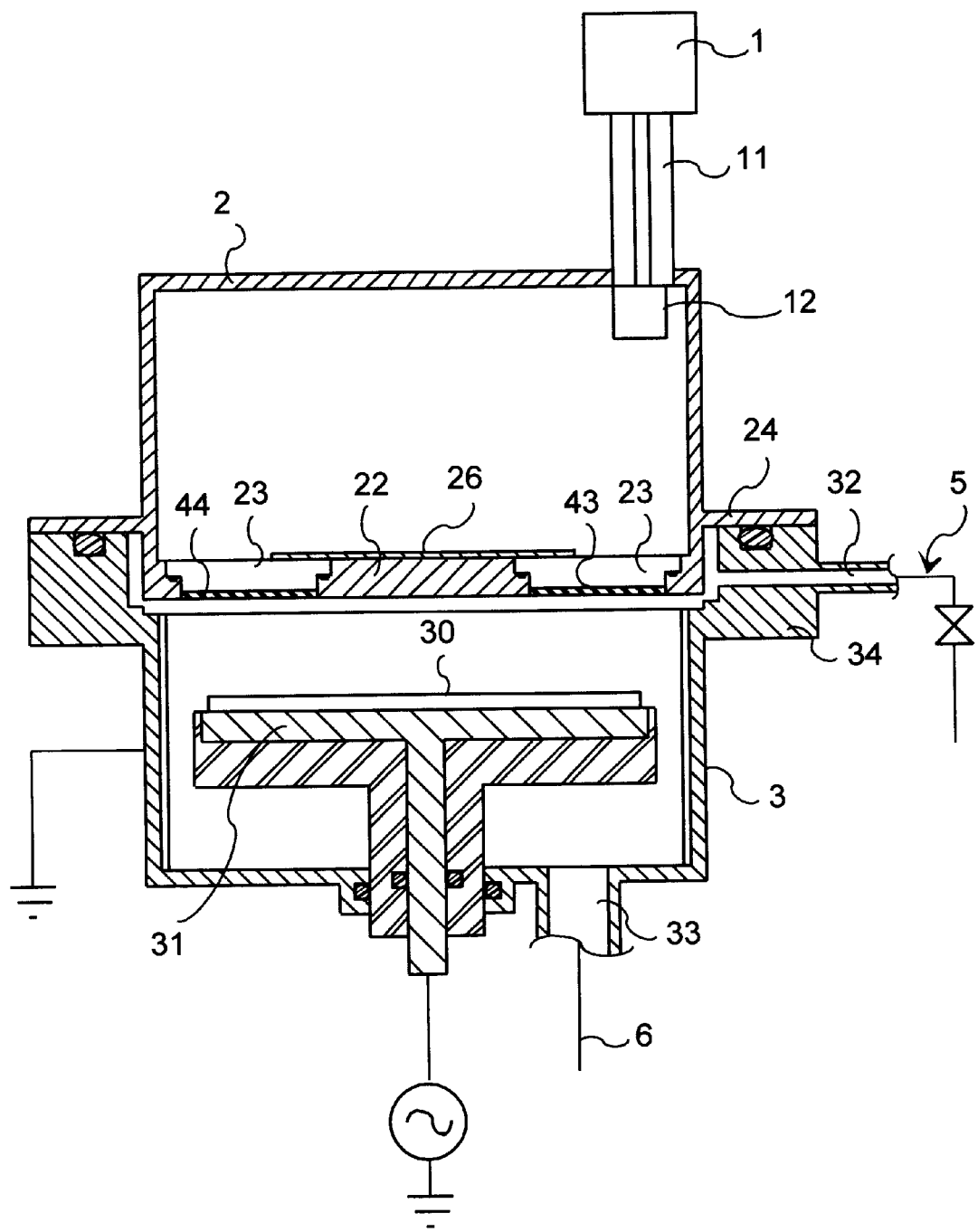
FIG. 7 is a front view which shows surface processing apparatus which is an embodiment of the invention of this application.
Figure 8:
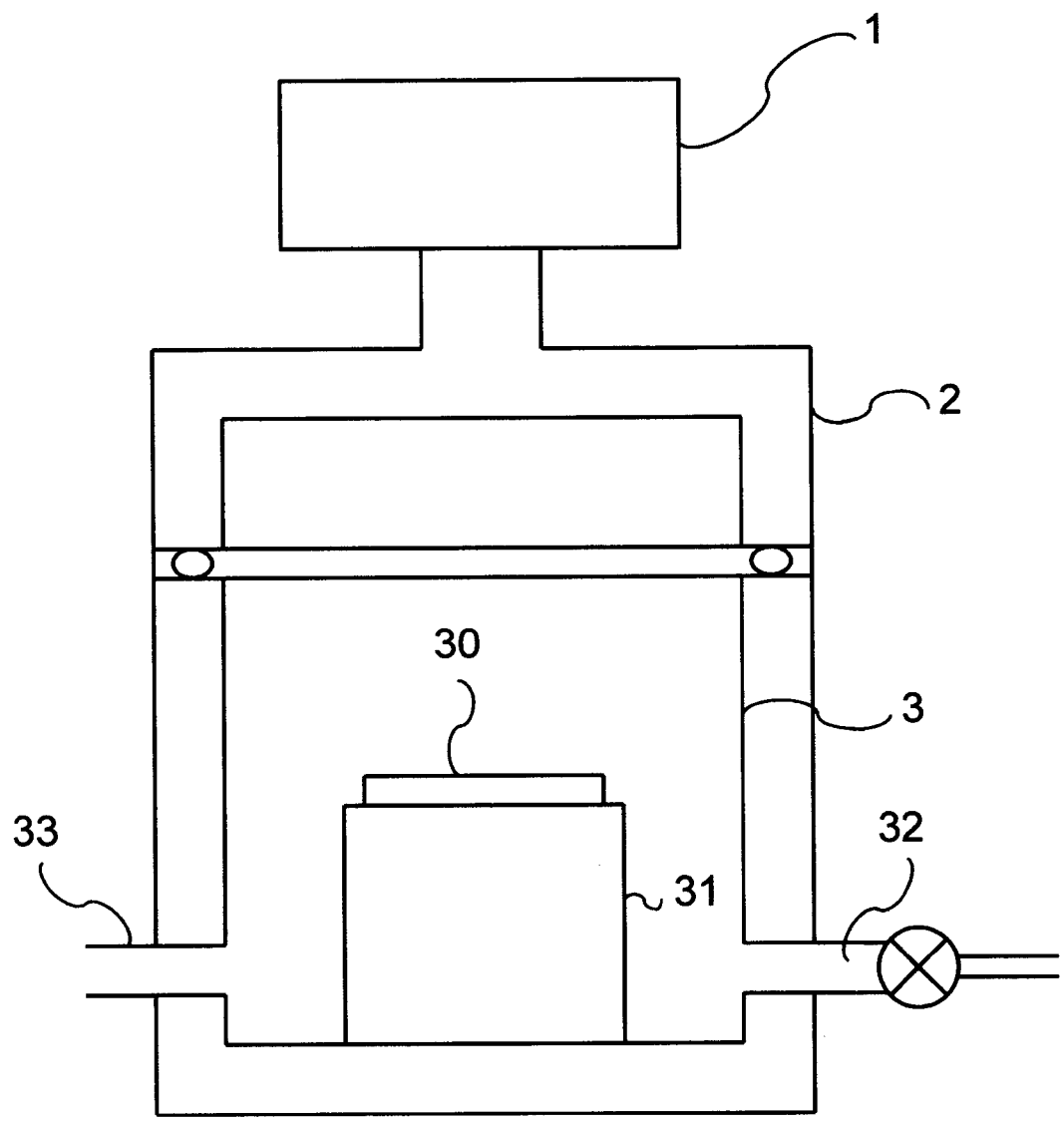
FIG. 8 is a drawing which shows the conventional surface processing apparatus indicated in Japanese Unexamined Patent Application 56-96841.

A front view which shows surface processing apparatus of an embodiment of the fourth invention of the application is shown in FIG. 7. In the apparatus shown in FIG. 7, a metal control plate 26 which controls the degree of microwave coupling of the cavity resonator 2 and the process chamber 3 is established for all of the plurality of radiation holes 23, cutting off part of each radiation hole 23.

In the apparatus of the embodiment described above, the microwaves which are resonating in the cavity resonator 2 are radiated into the process chamber 3 through the radiation holes 23. This signifies that the microwaves within the cavity resonator 2 and the microwaves which have been radiated into the process chamber 3 are introduced through the radiation holes 23.

The spatial impedance in the process chamber 3 changes when plasma is generated by the microwaves which have been radiated into the process chamber 3. This change in impedance has an effect on the resonance conditions in the cavity resonator 2 via the microwave coupling through the radiation holes 23. The plasma generating efficiency increases as the extent of the coupling of the microwaves through the radiation holes 23 becomes larger because more power is being introduced into the process chamber 3. If the extent of the coupling of the microwaves is considerable then the extent to which the resonance conditions of the cavity resonator 2 are changed by the state of plasma generation is also inevitably increased.

The magnitude of the extent of microwave coupling through the radiation holes 23 is set appropriately in consideration of these facts. In this case, the control plate 26 of this embodiment is effective when setting the degree of coupling. It is possible ultimately to select the degree of coupling at which the plasma generating efficiency is maximized by operating the apparatus with successive changes using control plates 26 of various sizes and measuring the plasma generating efficiency each time.

A single circular plate has been used for the control plate 26 in this embodiment, but ring-shaped plates such as to close off the circumferential part of each radiation hole 23 may be established for all of the radiation holes 23. Moreover, mechanisms which can control continuously the size of the aperture like those used for the iris in a camera can also be used.

The present invention of this application, as mentioned earlier, can be used in cases where a surface reaction proceeds using non-equilibrium plasma, which is to say low temperature plasma, but they are not limited to these situations, and of course they are also effective in cases where other surface treatments are being carried out, sometimes with the use of other plasmas.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A surface processing apparatus, comprising:

a microwave generator which generates low UHF band microwaves of from 300 MHz to 1 GHz, a cavity resonator in which the microwaves generated in the microwave generator resonate in the TM 010 mode, an airtight process chamber which is connected to the cavity resonator, a radiation plate which is arranged in a part of the cavity resonator which is connected with the process chamber, the radiation plate has a plurality of radiation holes which are established symmetrically with respect to a central axis of the cavity resonator, and cover plates made of a dielectric material which close off said radiation holes in an airtight manner.

2. The surface processing apparatus as claimed in claim 1, wherein the cavity resonator is of the re-entrant type.

3. The surface processing apparatus as claimed in claim 1, wherein a distance from the central axis of the aforementioned cavity resonator to centers of the radiation holes is within the range of 70%±10% of the radius of the cavity resonator.

4. The surface processing apparatus as claimed in claim 1, further comprising a control means made of metal for all of the radiation holes, for controlling a degree of coupling of microwaves of the cavity resonator and the process chamber by closing off parts of said radiation holes.

5. The surface processing apparatus as claimed in claim 1, wherein the radiation holes are circular.

* * * * *